United States Patent
Emoto et al.

(10) Patent No.: US 9,309,460 B2
(45) Date of Patent: Apr. 12, 2016

(54) PHOSPHOR, METHOD FOR PRODUCING SAME, AND USE OF SAME

(71) Applicant: DENKI KAGAKU KOGYO KABUSHIKI KAISHA, Tokyo (JP)

(72) Inventors: Hideyuki Emoto, Tokyo (JP); Hiroaki Toyoshima, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 81 days.

(21) Appl. No.: 14/374,815

(22) PCT Filed: Nov. 2, 2012

(86) PCT No.: PCT/JP2012/078437
§ 371 (c)(1),
(2) Date: Jul. 25, 2014

(87) PCT Pub. No.: WO2013/111411
PCT Pub. Date: Aug. 1, 2013

(65) Prior Publication Data
US 2015/0042222 A1    Feb. 12, 2015

(30) Foreign Application Priority Data
Jan. 27, 2012    (JP) ................. 2012-014879

(51) Int. Cl.
| | | |
|---|---|---|
| C09K 11/64 | (2006.01) |
| H01L 33/50 | (2010.01) |
| C09K 11/77 | (2006.01) |
| C09K 11/08 | (2006.01) |
| F21K 99/00 | (2010.01) |

(52) U.S. Cl.
CPC ......... *C09K 11/7734* (2013.01); *C09K 11/0883* (2013.01); *F21K 9/56* (2013.01); *H01L 33/502* (2013.01)

(58) Field of Classification Search
CPC ..................... C09K 11/7734; H01L 33/502
See application file for complete search history.

(56) References Cited

FOREIGN PATENT DOCUMENTS

| | | |
|---|---|---|
| CN | 101171884 A | 4/2008 |
| JP | 2004-71726 A | 3/2004 |
| JP | 2006-8721 A | 1/2006 |
| JP | 2006-8862 A | 1/2006 |
| JP | 2006-8948 A | 1/2006 |
| JP | 2006-16413 A | 1/2006 |
| JP | 2006-63323 A | 3/2006 |
| WO | WO 2005/052087 A | 6/2005 |
| WO | WO 2006/123259 A1 | 11/2006 |

OTHER PUBLICATIONS

Uhead et al, "An analysis of crystal structure of Ca-deficient oxonitridoaluminosilicate, Ca0.88Al0.91Si1.91N2.85O0.15", Journal of Ceramic Society of Japan, 117[1],pp. 94-98,2009.*

"An analysis of crystal structure of Ca-deficient oxonitridoaluminosilicate, $Ca_{0.88}Al_{0.91}Si_{1.09}N_{2.85}O_{0.15}$", Journal of the Ceramic Society of Japan, vol. 117 (2009), No. 1, p. 94-98.

International Search Report mailed Jan. 29, 2013, issued to corresponding International Application No. PCT/JP2012/078437.

Chinese Office Action dated Nov. 9, 2015, issued by the Chinese Patent Office in corresponding application 201280068195.2.

* cited by examiner

*Primary Examiner* — Carol M Koslow
(74) *Attorney, Agent, or Firm* — Stein IP, LLC

(57) ABSTRACT

Provided are: a phosphor that has a crystal structure identical to a $CaAlSiN_3$ crystal phase, which absorbs light of a light emitting element such as an LED and emits red light, as a host crystal and exhibits luminous efficiency more excellent than those of conventional phosphors; and a light emitting device which has high luminance and long service life by the use of this phosphor. A powder phosphor, which is represented by general formula $Ca_x(Si,Al)_2(N,O)_{3+y}$ (wherein $0.75 \leq x \leq 0.92$ and $-0.2 \leq y \leq 0.2$), and wherein some of Ca element is substituted by Eu element. This powder phosphor has an Si/Al ratio (molar ratio) of from 0.9 to 1.55 (inclusive), an Eu content of from 0.01 at % to 0.3 at % (inclusive), and an amount of intragranular solid-solved oxygen of from 0.4% by mass to 0.7% by mass (inclusive).

11 Claims, No Drawings

PHOSPHOR, METHOD FOR PRODUCING SAME, AND USE OF SAME

CROSS-REFERENCE TO RELATED APPLICATIONS

This application is a national stage of International Application No. PCT/JP2012/078437, filed Nov. 2, 2012, which claims the benefit of Japanese Application No. 2012-014879, filed Jan. 27, 2012, in the Japanese Patent Office. All disclosures of the document(s) named above are incorporated herein by reference.

BACKGROUND OF THE INVENTION

1. Field of the Invention

The present invention relates to a phosphor having a host crystal having the same crystal structure as that of a $CaAlSiN_3$ crystal phase that emits red light by absorbing light from a light emitting element such as LED, a method for producing the same, and an application of the same. More specifically, the present invention relates to a phosphor having a more improved emission efficiency than ever before, and a light emitting device with high brightness and long life by using the phosphor.

2. Description of the Related Art

A white LED is a device that emits white light in combination of a semiconductor light emitting element and a phosphor, and the combination of a blue LED and a YAG yellow phosphor is known as a typical example. However, since a YAG phosphor has an insufficient amount of red emission component, disadvantageously color rendering properties are insufficient for use in lighting, causing poor color reproducibility for an image display device such as a liquid crystal display backlight. Accordingly, in order to compensate for the red component of a white LED, a combination use of a nitride-based phosphor that emits red light with a YAG phosphor has been proposed (Patent Document 1).

It is known that, as a nitride-based phosphor that emits orange or red light, a $CaAlSiN_3$-based nitride or oxynitride material having a host crystal of inorganic compound having the same crystal structure as that of a $CaAlSiN_3$ crystal phase with an emission center of optically active element, Eu in particular, emits orange or red light with particularly high brightness (Patent Document 2).

Further improvement in emission characteristics of a phosphor is, however, still required to obtain a light emitting device with high brightness.

CITATION LIST

Patent Document

Patent Document 1: Japanese Paten Laid-Open No. 2004-071726
Patent Document 2: International Publication No. WO 2005/052087

SUMMARY OF THE INVENTION

Technical Problem

An object of the present invention is to provide a red-emitting phosphor which can achieve a higher light emission efficiency compared to a conventional nitride-based phosphor. A further object of the present invention is to provide a light emitting device with excellent color rendering properties, high brightness and long life by using the phosphor.

Solution to Problem

In order to solve the problem, the present inventors intensively studied the composition range adjacent to $CaAlSiN_3$ phosphor activated with $Eu^{2+}$. Consequently, it was found that a phosphor having excellent emission efficiency was made with a specific composition range deviated from the stoichiometric composition of Ca:Al:Si:N=1:1:1:3, and with a specific range of oxygen amount in solid solution form present inside particles (referred to as "amount of solid solution oxygen in particle"), not on the particle surface, in the total oxygen contained in a phosphor, leading to the present invention.

More specifically, the following is the outline of the present invention:

(1) A powder phosphor represented by a general formula $Ca_x(Si,Al)_2(N,O)_{3+y}$, wherein $0.75 \leq x \leq 0.92$ and $-0.2 \leq y \leq 0.2$, with some of Ca elements substituted with Eu elements, wherein the powder phosphor has a Si/Al ratio (molar ratio) of 0.9 or more and 1.55 or less, an Eu content of 0.01 at % or more and 0.3 at % or less, and an amount of solid solution oxygen in particle of 0.4 mass % or more and 0.7 mass % or less;

(2) The phosphor according to item (1), wherein the phosphor has a main crystal phase having the same crystal structure as that of $CaAlSiN_3$;

(3) A method for producing the phosphor according to item (1), comprising the step of heating a raw material powder mixture comprising a calcium nitride powder, a silicon nitride powder, an aluminum nitride powder, and an europium compound powder in nitrogen atmosphere, wherein the calcium nitride powder has a particle diameter of 250 μm or less and an oxygen content of 0.2 mass % or more and 1 mass % or less;

(4) The method for producing a phosphor according to item (3), wherein the raw material powder mixture has a total oxygen content of 0.2 mass % or more and 2.5 mass % or less;

(5) A light emitting device comprising the phosphor described in item (1) or (2) and a light emitting source.

(6) The light emitting device according to item (5), wherein the light emitting source emits ultraviolet or visible light;

(7) An image display device comprising the light emitting device according to item (5) or (6); and (8) A lighting device comprising the light emitting device according to item (5) or (6).

Advantageous Effects of Invention

In comparison with a conventional $CaAlSiN_3$ phosphor, the phosphor of the present invention has higher brightness, higher emission efficiency, more excellent thermal and chemical stability, and less reduction in brightness at high temperature, being suitably used in a light emitting device in need of red emission. The method for producing a phosphor of the present invention can stably provide a large quantity of phosphors having high emission efficiency.

Additional aspects and/or advantages of the invention will be set forth in part in the description which follows and, in part, will be obvious from the description, or may be learned by practice of the invention.

DETAILED DESCRIPTION OF THE EMBODIMENTS

The present invention is described in detail in the following.

The phosphor of the present invention is an oxynitride phosphor represented by a general formula $Ca_x(Si,Al)_2(N,O)_{3+y}$. The skeletal structure of the material includes combined $(Si,Al)$—$(N,O)_4$ regular tetrahedrons, with Ca elements located in the gaps among the tetrahedrons. The composition maintains electrical neutrality by the whole parameters including the occupancy rate of Ca elements, the Si/Al ratio, and the N/O ratio. Examples of the typical crystal represented by the general formula include $CaAlSiN_3$ with a Ca site occupancy rate of 100%, further satisfying: Si/Al=1 and O/N=0. When some of the $Ca^{2+}$ ions in $CaAlSiN_3$ are substituted with $Eu^{2+}$ ions, a red phosphor is produced.

The distinctive features of the $CaAlSiN_3$ crystal-based phosphor of the present invention for achieving a higher emission efficiency include composition parameters in a specific range deviated from the typical $CaAlSiN_3$ composition and a strictly controlled amount of solid solution oxygen in a crystal.

The phosphor of the present invention has a coefficient x for Ca element in the general formula in the range of 0.75 or more and 0.92 or less, and preferably in the range of 0.84 or more and 0.91 or less. With a coefficient x of less than 0.75, it is difficult to maintain the $CaAlSiN_3$ crystal, resulting in significant reduction in the fluorescence intensity due to generation of a large amount of different phases other than the desired crystal. On the other hand, with a coefficient x of more than 0.92, the fluorescence intensity is inclined to decrease, though the reason is not clear.

The electrical neutrality is maintained by the occupancy rate of Ca site, the Si/Al ratio, and the O/N ratio. A single crystal having no defects or the like satisfies: y=0. However, it is believed that crystal phases and amorphous phases different from the main phase are present in focusing on the composition of the entire phosphor, and it is believed that the charge balance is broken due to crystal defects in focusing on the crystal itself. In the present invention, in view of increasing the abundance ratio of an objective crystal phase for enhancement of the fluorescence intensity, y is in the range of −0.2 or more and 0.2 or less, and preferably in the range of −0.12 or more and 0.06 or less.

The amount of solid solution oxygen in particle is in the range of 0.4 mass % or more and 0.7 mass % or less, and preferably in the range of 0.55 mass % or more and 0.65 mass % or less. With an amount of solid solution oxygen in particle in the range of 0.4 mass % or more and 0.7 mass % or less, a phosphor having high crystallinity is obtained, so that the emission intensity increases.

Since the particle surface of nitride or oxynitride powder with a low oxygen content is extremely unstable in atmospheric air, an oxide coating is usually formed on the particle surface. As a result, when the amount of oxygen in a phosphor is measured by a common method, the total amount of oxygen present i the oxide coating and solid solution oxygen in particle is obtained without distinction. However, since the amount of oxygen present in the oxide coating and the amount of solid solution oxygen in a crystal have a clearly different effect on the emission characteristics, it is important for obtaining a phosphor having high emission intensity to control the amount of oxygen solid-soluted in a crystal, i.e. the amount of solid solution oxygen in particle. Accordingly, the oxygen amount closely related to emission characteristics should have not been figured out by a conventional method for measuring the total amount of oxygen contained in a phosphor.

According to the most common method for measuring the solid solution oxygen in particle, a sample placed in a graphite crucible is melted by heating so as to generate oxygen, which is converted to $CO_2$ for measurement by an infrared detector. Oxygen present in the particle surface is relatively easily desorbed at low temperature (lower than 1500° C.). In contrast, high temperature (1500 to 1900° C.) is required for oxygen in a crystal to be desorbed. Accordingly, the amount of solid solution oxygen in particle alone can be measured through controlling melting temperature conditions such as two-step temperature rising including low temperature and high temperature heating.

Further, with removal of $CO_2$, the $N_2$ amount can also be measured by a thermal conductivity detector in such a device, allowing for simultaneous measurement of the oxygen amount and the nitrogen amount. Although $N_2$ is not released at the low temperature conditions for desorption of oxygen on the particle surface, $N_2$ is released at high temperature conditions for desorption of oxygen in a crystal. Using the characteristic, in comparison with the $N_2$ detection behavior, the amount of oxygen extracted simultaneously with $N_2$, i.e. solid solution oxygen in particle, can be accurately obtained.

The Si/Al ratio (molar ratio) is 0.9 or more and 1.55 or less. The Si/Al ratio is inevitably determined to form a stable $CaAlSiN_3$ crystal phase having electrical neutrality, corresponding to the coefficient x of Ca element and the O/N atomic ratio.

With an excessively small content of Eu as emission center of the phosphor of the present invention, the contribution to light emission is inclined to be reduced, while with an excessively large content, the concentration quenching of phosphor by energy transfer between $Eu^{2+}$ ions is inclined to occur. Accordingly, the content of Eu is 0.01 at % or more and 0.3 at % or less, preferably 0.04 at % or more and 0.2 at % or less, and more preferably 0.06 at % or more and 1.5 at % or less.

The main crystal phase of the phosphor of the present invention preferably has the same structure as that of the $CaAlSiN_3$ crystal in orthorhombic system, which can be confirmed by powder X-ray diffraction. A crystal structure different from $CaAlSiN_3$ is not preferred, causing emission of a color other than red or significant reduction in fluorescence intensity. Although the crystal phase present in a phosphor is preferably formed of the single phase of crystal, the crystal phase may include a different phase as long as having no significant effect on the characteristics of a phosphor. Examples of the different phase having low effect on the fluorescent characteristics include $Ca_2Si_5N_8$, α-sialon, and AlN. The $Ca_2Si_5N_8$ may include a small amount of Al in Si sites and a small amount of solid solution O in N sites, which is represented by a general formula $Ca_2(Si,Al)_5(N,O)_8$. Preferably the amount of different phase is an amount having a diffraction line intensity of the other crystal phase of 10% or less relative to the strongest diffraction intensity of the crystal phase in evaluation by powder X-ray diffraction method.

A method for producing a phosphor of the present invention may employ the same method for producing a conventional $CaAlSiN_3$-based phosphor with the exception of raw materials. A method for firing raw material powder mixture for forming a composition represented by the general formula in nitrogen atmosphere at a predetermined temperature range is exemplified in the following.

In the production method, nitrides of the constituent elements, i.e. calcium nitride, silicon nitride, aluminum nitride, and europium nitride, are suitably used. In general, nitride powder is unstable in air, having the particle surface covered with an oxide coating layer. Accordingly, even using nitride materials, some extent of oxygen is contained in the raw materials. In the present invention, the total oxygen content in the raw material powder mixture including the oxygen content in the oxide coating is preferably 0.2 mass % or more and 2.5 mass % or less. With a total oxygen content of more than 2.5 mass %, the amount of solid solution oxygen in particle of a phosphor to be obtained is increased, resulting in reduction in fluorescence intensity. In contrast, with a total oxygen content of less than 0.2 mass %, each of the raw material powder has extremely high cost with difficulty in handling, being not preferred in terms of cost and productivity.

As long as the total oxygen content is within the range, oxides may be used. For example, as a source of europium functioning as emission center with an extremely small addition amount, europium oxide which is easily available may be used.

Among the raw material nitride powder, calcium nitride and europium nitride react violently with moisture and oxygen in air. Accordingly, handling thereof is performed in a glove box under atmosphere substituted with an inert gas. In particular, since a calcium nitride powder accounting for a significant proportion of raw material has a large effect on the characteristics of a phosphor to be finally obtained, it is preferred to have a particle diameter of 250 μm or less and an oxygen content of 0.2 mass % or more and 1 mass % or less. A calcium nitride powder having a particle diameter of more than 250 μm is not preferred, since synthesis reaction of a phosphor becomes heterogeneous during firing at high temperature, causing variation in fluorescence intensity and generation of a different phase. A calcium nitride powder having an oxygen content of more than 1 mass % is not preferred, causing reduction in the fluorescence intensity of a phosphor to be finally obtained. It is technically difficult to obtain a calcium nitride powder having an oxygen content of less than 0.2 mass %, in the case of having a particle diameter of 250 μm or less.

In mixing each of the raw material powder, predetermined amounts of silicon nitride, aluminum nitride, and europium oxide in some cases, which can be handled in air, are weighed, thoroughly mixed in air in advance, and carried in a glove box. In the glove box, the calcium nitride and europium nitride on an as needed basis, which are unstable in air, are then blended, thoroughly mixed, and filled into a firing container as a raw material powder mixture.

The firing container is preferably formed of a material that is stable in nitrogen atmosphere at high temperature and hardly to react with the raw material powder mixture and a reaction product thereof. A firing container formed of boron nitride is suitably used.

The firing container filled with the raw material powder mixture is taken out from the glove box, immediately set in a firing furnace, and fired under nitrogen atmosphere at 1600° C. or higher and 1900° C. or lower. The amount of unreacted residue increases at excessively low firing temperature, and the main phase having the same crystal structure as that of $CaAlSiN_3$ is decomposed at excessively high firing temperature, which are not preferred.

The firing time range is selected to avoid disadvantages such as presence of a large amount of unreacted materials, insufficient grain growth, and reduction in productivity, preferably being 2 hours or more and 24 hours or less in a typical case.

The pressure of the firing atmosphere is selected depending on the firing temperature. The phosphor of the present invention can be stable under atmospheric pressure at temperatures up to about 1800° C. At a temperature thereabove, a pressurized atmosphere is required to suppress the degradation of the phosphor. The higher the ambient pressure is, the higher the decomposition temperature of the phosphor becomes. The ambient pressure is, however, preferably less than 1 MPa, considering the industrial productivity.

A fired product may be in a various state, such as in a powder form, a massive form, or a sintered form, depending on the raw material blending and firing conditions. For use as phosphor, a fired product is formed into powder having a predetermined size using a combination of operations including cracking, pulverization, and/or classification. For suitable use as phosphor for an LED, preferably the average particle diameter of a fired product is adjusted to 5 to 30 μm.

In production of the phosphor, an acid treatment step for removing impurities and an annealing step for improving crystallinity may be further performed.

The phosphor of the present invention may be used in light emitting device composed of a light emitting source and a phosphor. In particular, with irradiation of ultraviolet light rays and visible light rays including a wavelength of 350 nm or more and 500 nm or less as excitation source, the phosphor having emission characteristics with a fluorescence peak at the vicinity of a wavelength of 650 nm allows white light to be easily obtained in combination with a light emitting source such as an ultraviolet LED or blue LED, or in further combination with a green to yellow phosphor and/or blue phosphor on an as needed basis.

Since the phosphor of the present invention has the same crystal structure as that of the $CaAlSiN_3$ crystal phase having excellent stability, the phosphor has less reduction in brightness at high temperatures, excellent resistance to high temperature causing no deterioration when exposed to high temperature, and excellent long-term stability in oxidizing atmosphere and moisture environment. Consequently, a light emitting device using the phosphor has less reduction in brightness and less color shift, achieving high brightness and long life.

EXAMPLES

Examples of the present invention are described in detail with reference to Table 1. In Table 1, the composition parameters, the Eu content, the amount of solid solution oxygen in particle, and the fluorescence characteristics of phosphors in Examples and Comparative Examples are shown.

TABLE 1

| | x value | y value | Si/Al (molar ratio) | Eu content (at %) | Amount of solid solution oxygen in particle (mass %) | Fluorescence characteristics (455 nm excitation) | | |
|---|---|---|---|---|---|---|---|---|
| | | | | | | Peak wavelength (nm) | Half width (nm) | Integrated intensity (%) |
| Example 1 | 0.87 | −0.01 | 1.24 | 0.09 | 0.61 | 651 | 98 | 100 |
| Example 2 | 0.91 | −0.04 | 1.1 | 0.08 | 0.62 | 650 | 92 | 105 |
| Example 3 | 0.85 | 0.05 | 1.38 | 0.09 | 0.57 | 645 | 105 | 103 |
| Example 4 | 0.88 | −0.12 | 1.12 | 0.14 | 0.64 | 656 | 92 | 99 |
| Comparative Example 1 | 0.85 | 0.08 | 1.23 | 0.09 | 1.12 | 648 | 102 | 95 |
| Comparative Example 2 | 0.78 | 0.12 | 1.23 | 0.09 | 0.35 | 653 | 96 | 90 |
| Comparative Example 3 | 0.74 | 0.03 | 1.63 | 0.08 | 0.52 | 642 | 109 | 89 |
| Comparative Example 4 | 1.13 | −0.05 | 0.83 | 0.08 | 0.65 | 643 | 99 | 72 |
| Comparative Example 5 | 0.89 | −0.03 | 1.11 | 0.005 | 0.68 | 643 | 90 | 65 |
| Comparative Example 6 | 0.91 | 0.01 | 1.13 | 0.32 | 0.65 | 663 | 92 | 75 |

Example 1

The phosphor in Example 1 was prepared by the following method.

Using ethanol as solvent, 57.0 mass % of an α-type silicon nitride powder (made by Ube Industries, Ltd., SN-E10 grade, oxygen content: 1.0 mass %), 41.6 mass % of an aluminum nitride powder (made by Tokuyama Corporation, E-grade, oxygen content: 0.8 mass %), and 1.4 mass % of europium oxide (made by Shin-Etsu Chemical Co., Ltd., RU grade) were mixed by ball mill with a nylon pot and silicon nitride balls. After removal of the solvent by drying, the mixture was passed through a sieve with a mesh opening of 75 μm for removal of aggregates.

The powder mixture was carried in a glove box purged with nitrogen, and a calcium nitride powder (made by Materion Corp.; purity: 99%; particle diameter: 75 μm or less; oxygen content: 0.6 mass %) was added to the mixture for mixing with a mortar. The mixing ratio satisfied: (the powder mixture):(calcium nitride powder)=(66.8 mass %):(33.2 mass %). The oxygen content of the entire raw material powder mixture was 0.8 mass %, being calculated from the oxygen content of each of the raw material powder and the blending ratio.

The obtained raw material powder mixture was filled in a cylindrical container made of boron nitride with a lid (made by Denki Kagaku Kogyo Kabushiki Kaisha, N-1 grade) in a glove box, taken out from the glove box, and immediately set in an electric furnace with a carbon heater. The furnace chamber was thoroughly vacuum evacuated to 0.1 Pa or below. Heating was initiated in parallel with vacuum evacuation. Nitrogen gas was injected to the furnace chamber at 600° C. and the furnace atmospheric pressure was set to 0.1 MPa. After injection of the gas, temperature was directly raised to 1800° C., and firing was performed at 1800° C. for 4 hours.

After cooling, the sample collected from the furnace in a red massive form was cracked with a mortar and finally passed through a sieve with a mesh opening of 45 μm.

The composition analysis of a phosphor obtained by passing through a sieve of 45 μm was performed as follows.

The content of Ca, Eu, Si, and Al was measured by ICP emission spectrometry apparatus (made by Rigaku Corporation, CIROS-120) after the powders were dissolved with the alkaline resolution method. The content of oxygen and nitrogen was measured by an oxygen and nitrogen elemental analyzer (made by Horiba, Ltd., EMGA-920). In the measurement, a sample was placed in a graphite crucible and held at 280° C. (melting voltage: 0.5 KW) for 50 seconds for removal of surface adsorbed material. The temperature was then raised to 2400° C. (melting voltage: 5.5 KVV) in 200 seconds. By subtracting the background obtained in advance for processing an empty crucible under the same conditions, oxygen and nitrogen extraction curves for temperature rise were obtained. Both of the extraction distribution of oxygen and nitrogen had a peak at about 1650° C., and the distribution of oxygen was observed on the low temperature side considerably away from the peak. Accordingly, peak separation was performed for the extraction curve of oxygen for temperature rise. It was assumed that the distribution extracted in parallel with nitrogen on the high temperature side was derived from the solid solution oxygen in particle, and the other distribution on the low temperature side was derived from the surface oxygen. The ratio thereof was obtained from the area ratio. Using a calibration curve prepared from measurement values for silicon nitride powder including a known amount of oxygen and a known amount of nitrogen (certified by the Ceramic Society of Japan, JCRM R005), the total amount of oxygen, the total amount of nitrogen, and the amount of solid solution oxygen in particle calculated by multiplying the total amount of oxygen by the ratio of the solid solution oxygen in particle were obtained.

The powder had a composition: Ca:Eu:Al:Si:O:N=14.73: 0.09:15.19:18.83:1.27:49.90 (at %). The composition fitted to the general formula satisfies: x=0.87, y=0.01, Si/Al (molar ratio)=1.24. The amount of solid solution oxygen in particle obtained by the method was 0.60 mass %.

The phosphor was subjected to powder X-ray diffraction using a CuKα radiation, with an X-ray diffraction apparatus (made by Rigaku Corporation, ULTIMA IV). The obtained X-ray diffraction pattern included the pattern identical to that of the $CaAlSiN_3$ crystal described in Patent Document 2, and a diffraction pattern of a slight amount of AlN as a different phase.

Furthermore, fluorescence measurement was performed by using a fluorescence spectrophotometer (made by Hitachi High-Technologies Corporation, F-7000) corrected with rhodamine B and a secondary standard light source. In the measurement, an accessory solid sample holder of the photometer was used to obtain the fluorescence spectrum at an excitation wavelength of 455 nm. The peak wavelength of the fluorescence spectrum was 651 nm, with a half width of 98 nm. As the fluorescence intensity, the value of integral of the fluorescence spectrum in the wavelength range of 470 nm or more and 800 nm or less was used.

In measurement of the following Examples and Comparative Examples, the sampling method and the conditions were exactly identical to those for Example 1. The integrated fluorescence intensity is shown as a relative value of 100% in Example 1.

Comparative Examples 1 and 2

In Comparative Example 1, the calcium nitride powder for use in Example 1 was stirred and exposed to the atmosphere, so as to have an oxygen content of 1.5 mass %. In Comparative Example 2, the calcium nitride powder in a granular form (particle diameter of several mm or less) was cracked with a mortar in a glove box purged with nitrogen and passed through a sieve with a mesh opening of 300 μm for use as the raw material powder. The oxygen content of the calcium nitride powder in Comparative Example 2 was 0.15 mass %. Except for the use of the calcium nitride raw material powder, exactly the same raw materials, blending ratio, and method as in Example 1 were used to prepare a phosphor for evaluation. From the X-ray diffraction pattern obtained by powder X-ray diffraction method, both of the phosphors had a main phase of $CaAlSiN_3$ crystal identical to that in Example 1.

Examples 2, 3 and 4 and Comparative Examples 3, 4, 5, and 6

Using the same raw material powder as in Example 1 with a different blending ratio, each of the phosphor powder in Examples 2, 3, and 4, and Comparative Examples 3, 4, 5 and 6 was prepared under the same conditions as in Example 1. The main crystal phase of each was $CaAlSiN_3$.

As is apparent from the comparison of Examples 1 to 4 with Comparative Examples 1 and 2, when the solid solution oxygen in particle was controlled in the range of 0.4 mass % or more and 0.7 mass % or less, a red phosphor having high emission efficiency was obtained. Further, as is apparent from the comparison of Examples 1 to 4 with Comparative Examples 3 to 6, when the composition of a phosphor was intentionally deviated from the typical $CaAlSiN_3$ composition and controlled to satisfy $0.75 \leq x \leq 0.92$ and $-0.2 \leq y \leq 0.2$ in a general formula $Ca_x(Si,Al)_2(N,O)_{3+y}$, with a Si/Al ratio (molar ratio) of 0.9 or more and 1.55 or less, and an Eu content of 0.01 at % or more and 0.3 at % or less, the integrated intensity was significantly improved.

Example 5 and Comparative Example 7

A light emitting device in Example 5 included the phosphor in Example 1, a green-emitting phosphor, and a blue-emitting LED as a light emitting source, although drawing and description in table were omitted. In Comparative Example 7, except that the phosphor in Comparative Example 1 was used instead of the phosphor in Example 1, a light emitting device was prepared in the same way as in Example 5. Due to the use of the phosphor in Example 1, the light emitting device in Example 5 had higher brightness and longer life compared to the light emitting device in Comparative Example 7, which uses the phosphor in Comparative Example 1.

Examples 6 and 7 and Comparative Examples 8 and 9

An image display device in Example 6 includes a light emitting device in Example 5. A lighting device in Example 7 includes the light emitting device in Example 5. An image display device in Comparative Example 8 includes light emitting device in Comparative Example 7. A lighting device in Comparative Example 9 includes the light emitting device in Comparative Example 7. In both of Examples 6 and 7, higher brightness and longer life were achieved due to the use of the phosphor in Example 1, compared to the image display device in Comparative Example 8 and the lighting device in Comparative Example 9 which use the phosphor in Comparative Example 1.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. A powder phosphor represented by a general formula $Ca_x(Si,Al)_2(N,O)_{3+y}$, wherein $0.75 \leq x \leq 0.92$ and $-0.2 \leq y \leq 0.2$, with some of Ca elements substituted with Eu elements, wherein the powder phosphor has a Si/Al ratio (molar ratio) of 0.9 or more and 1.55 or less, an Eu content of 0.01 at % or more and 0.3 at % or less, and an amount of solid solution oxygen in particle of 0.4 mass % or more and 0.7 mass % or less.

2. The phosphor according to claim 1, wherein the phosphor has a main crystal phase having the same crystal structure as that of $CaAlSiN_3$.

3. A method for producing the phosphor according to claim 1, comprising the step of heating a raw material powder mixture comprising a calcium nitride powder, a silicon nitride powder, an aluminum nitride powder, and an europium compound powder in nitrogen atmosphere, wherein the calcium nitride powder has a particle diameter of 250 μm or less and an oxygen content of 0.2 mass % or more and 1 mass % or less.

4. The method for producing a phosphor according to claim 3, wherein the raw material powder mixture has a total oxygen content of 0.2 mass % or more and 2.5 mass % or less.

5. A light emitting device comprising the phosphor according to claim 1 and a light emitting source.

6. The light emitting device according to claim 5, wherein the light emitting source emits ultraviolet or visible light.

7. An image display device comprising the light emitting device according to claim 5.

8. A lighting device comprising the light emitting device according to claim 5.

9. A light emitting device comprising the phosphor according to claim 2 and a light emitting source.

10. An image display device comprising the light emitting device according to claim 6.

11. A lighting device comprising the light emitting device according to claim 6.

* * * * *